United States Patent [19]
Jylhä

[11] Patent Number: 5,406,231
[45] Date of Patent: Apr. 11, 1995

[54] OSCILLATOR UNIT WITH IMPROVED FREQUENCY STABILITY

[75] Inventor: Raimo Jylhä, Oulu, Finland

[73] Assignee: Nokia Telecommunications OY, Espoo, Finland

[21] Appl. No.: 81,296

[22] PCT Filed: Dec. 19, 1991

[86] PCT No.: PCT/FI91/00402
§ 371 Date: Jun. 28, 1993
§ 102(e) Date: Jun. 28, 1993

[87] PCT Pub. No.: WO92/12576
PCT Pub. Date: Jul. 23, 1992

[30] Foreign Application Priority Data
Jan. 9, 1991 [FI] Finland .................................. 910115

[51] Int. Cl.[6] .................... H03L 7/00; H03B 28/00
[52] U.S. Cl. ........................................ 331/49; 331/46; 331/74
[58] Field of Search ............... 331/1 R, 1 A, 44, 46, 331/49, 56, 64, 74

[56] References Cited
U.S. PATENT DOCUMENTS

| | | | |
|---|---|---|---|
| 4,583,054 | 4/1986 | Basile | 331/49 X |
| 4,629,999 | 12/1986 | Hatoh et al. | 331/1 R |
| 5,063,357 | 11/1991 | Williams et al. | 331/49 |

FOREIGN PATENT DOCUMENTS

| | | | |
|---|---|---|---|
| 669075 | 2/1989 | Switzerland | H03B 21/02 |
| WO8400648 | 2/1984 | WIPO | H03B 21/02 |

*Primary Examiner*—David Mis
*Attorney, Agent, or Firm*—Cushman Darby & Cushman

[57] ABSTRACT

An oscillator unit with improved frequency stability, including at least three oscillators having the same nominal frequency. A selector is provided for selecting one of the oscillators (1, 2, 3) for connection to an output (14a) of the oscillator unit. The oscillator frequencies are compared in pairs with each other. The selector is controlled by a controller to replace the oscillator connected to the output of the oscillator unit with another oscillator if the frequency of the oscillator currently connected to the output deviates from the frequencies of the other oscillators by at least as much as a predetermined frequency difference.

3 Claims, 1 Drawing Sheet

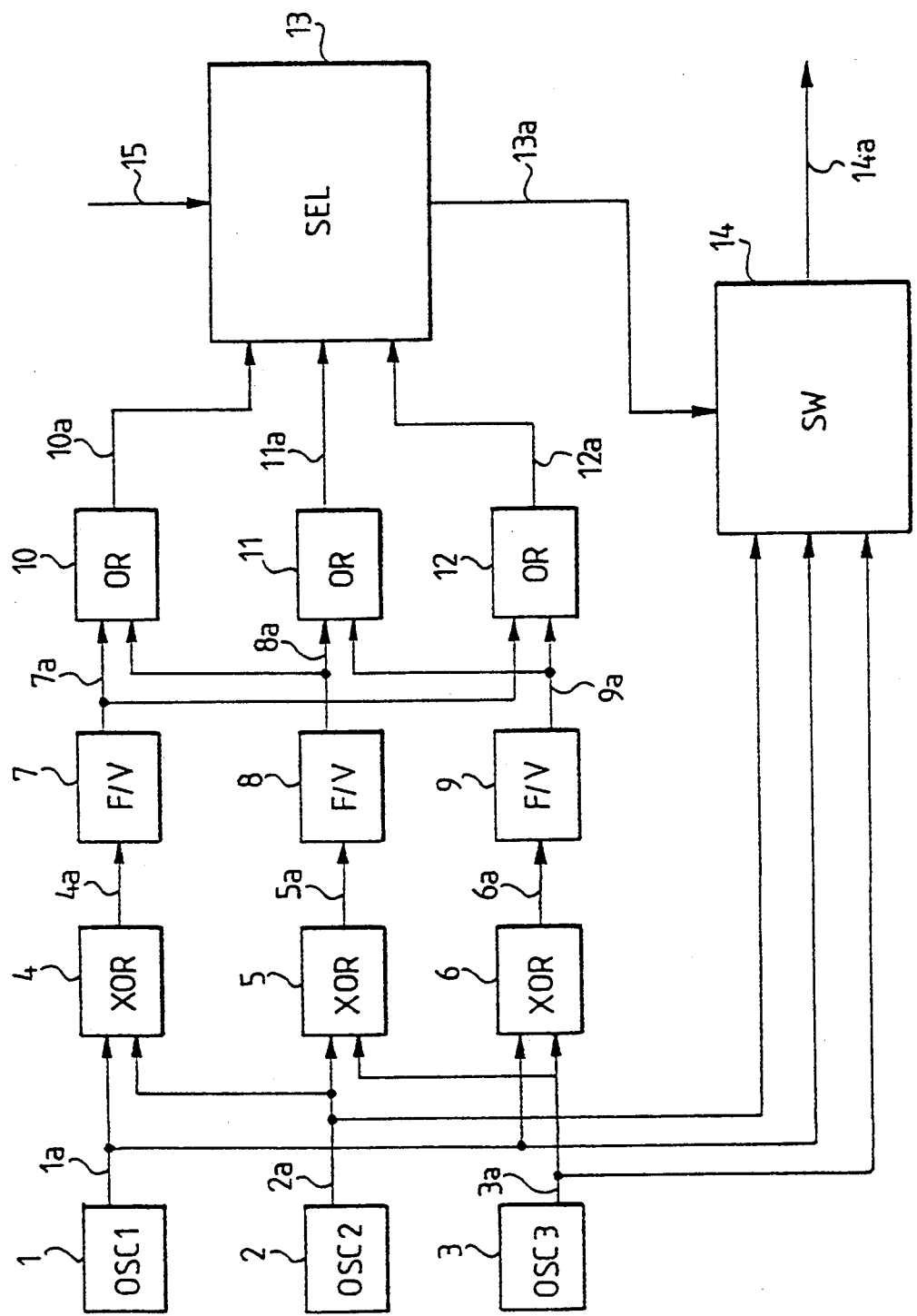

OSCILLATOR UNIT WITH IMPROVED FREQUENCY STABILITY

BACKGROUND OF THE INVENTION

The invention relates to an oscillator unit with improved frequency stability.

The specifications of the new European digital mobile radio system GSM (Groupe Special Mobile) define that the nominal frequency of the oscillator unit of the base station, that is, the basic frequency from which the clock and synchronization signals of the base station are derived, must not deviate more than 0.6 Hz from the specified value. Therefore there is a need for an oscillator unit of adequate frequency stability.

SUMMARY OF THE INVENTION

The object of the invention is to provide an oscillator arrangement with reliable frequency stability.

This is achieved by means of an oscillator unit according to the invention, which is characterized in that it comprises:
at least three oscillators having the same nominal frequency;
means for selecting one of the oscillators for connection to an output of the oscillator unit;
means for comparing the oscillator frequencies in pairs with each other and for controlling the selecting means to replace the oscillator connected to the output of the oscillator unit with another oscillator if the frequency of the oscillator currently connected to the output deviates from the frequencies of the other oscillators at least by a predetermined frequency difference.

The invention utilizes at least three oscillators of the same nominal frequency. One of the oscillators is connected to generate the output frequency of the oscillator unit, and the oscillator frequencies are compared in pairs with each other. It is thereby possible to identify an individual oscillator the frequency of which starts to drift away from the frequency of the other oscillators. If such an unstable oscillator is currently connected to the output of the oscillator unit, it can be replaced with a more stable stand-by oscillator if the deviation of its output frequency from the output frequency of the other oscillators exceeds a predetermined frequency difference. At the same time, an alarm can be given to indicate the failure of the oscillator. In this way, an oscillator unit of adequate reliability and frequency stability is achieved according to the invention.

BRIEF DESCRIPTION OF THE DRAWING

The invention will now be described in greater detail by means of an illustrating embodiment with reference to the attached drawing, in which: The sole FIGURE shows a block diagram of an oscillator unit according to the invention.

DETAILED DESCRIPTION

The oscillator unit according to the invention comprises at least three oscillators 1, 2 and 3 having the same nominal frequency and comprising outputs 1a, 2a, 3a, respectively, of which one is switched to an output 14a of the entire oscillator unit by a switching unit 14. The switching unit 14 selects the oscillator to be connected to the output 14a in response to a selection signal 13a from a selection unit 13. The selection unit 13, in turn, causes the switching unit 14 to change the oscillator either on receiving information from a special oscillator monitoring circuitry about a change in the frequency of the oscillator connected to the output, or in response to a control signal 15.

To monitor the frequencies of the oscillators 1, 2 and 3, their outputs are connected to a special frequency comparison circuitry which compares the output frequencies of the oscillators in pairs with each other and causes the selection unit 13 to replace the oscillator currently connected to the output 14a of the oscillator arrangement with another redundant oscillator if the frequency of the current oscillator deviates from the frequencies of the redundant oscillators at least by a predetermined frequency difference.

In the preferred embodiment of the invention shown in the figure, the frequency comparison circuitry comprises three circuits 4, 5 and 6 performing the logic XOR operation. The input signals of the XOR circuit 4 include the output signals 1a and 2a of the oscillators 1 and 2; the input signals of the XOR circuit 5 include the output signals 2a and 3a of the oscillators 2 and 3; and the input signals of the XOR circuit 6 include the output signals 1a and 3a of the oscillators 1 and 3. Each XOR circuit 4, 5 and 6 continuously performs the logic XOR operation on the respective input signal pair, whereby the output signal of the XOR circuit is 0 if the input signals are of the same frequency and of equal phase, and a sequence of pulses if there is a phase difference between the input signals. The width (frequency) of the individual pulses in the sequence of pulses in the output signal thus depends on the amount of the phase difference between the input signals of the XOR circuit.

The output signals 4a, 5a, 6a of each XOR circuit 4, 5, 6 are connected to a frequency voltage converter 7, 8 and 9, respectively. Each frequency voltage converter 7, 8, 9 converts the sequence of pulses applied to it to a corresponding voltage the level of which is proportional to the frequency difference between the signals being compared, and contains a threshold level comparator for comparing the voltage level so produced with a predetermined reference voltage which corresponds to a predetermined permissible frequency difference between the input signals of the XOR circuit. The logic state of the threshold level comparator and thus the state of the output signal of the entire frequency voltage converter 7, 8 or 9 changes from 0 to 1 if the converted voltage level exceeds the reference voltage. Thus, the state of the output signal of the frequency converter 7 indicates whether the difference between the frequencies of the oscillators 1 and 2 is less than the predetermined frequency difference. The output signals of the frequency voltage converters 8 and 9 indicate the same matter as concerns the difference between the frequencies of the oscillators 2 and 3, and the oscillators 1 and 3, respectively.

When the frequency of one oscillator 1, 2 or 3 deviates from the frequency of the other two oscillators more than what is permissible, the logic state of two frequency voltage converters is changed from 0 to 1. The unstable oscillator can now be identified by checking the oscillator the output signal which constituted one of the compared input signals in both converters, with output state 1. For example, if the output signals 7a and 9a of the frequency voltage converters 7 and 9 are in the logic state 1, the oscillator 1 can be identified as unstable as it is the only oscillator connected to both the XOR gate 4 and the XOR gate 6.

For the above-mentioned oscillator identification, the oscillator unit shown in the figure comprises three circuits, 10, 11 and 12, performing the logic OR operation. The output signals 7a, 9a of the converters 7 and 9 are the input signals of the OR circuit 10; the output signals 8a and 9a of the converters 8 and 9 are the input signals of the OR circuit 11; and the output signals 7a and 9a of the converters 7 and 9 are the input signals of the OR circuit 12. Thus, the logic state 1 of the output signal 10a of the OR circuit 10 indicates directly an excessive frequency deviation of the oscillator 1. The output signal 11a of the OR circuit 11 and the output signal 12a of the OR circuit 12 indicate the same matter as concerns the oscillator 2 and the oscillator 3, respectively. The signals 10a, 11a and 12a are applied as control inputs to the selection unit 13.

The oscillator unit operates in the following way. Assume that the oscillator 1 is currently connected by the switching unit 14 to the output 14a of the oscillator unit. Then, the frequency of the oscillator 1 starts to drift away from the frequency of the stand-by oscillators 2 and 3 until the frequency difference exceeds a permissible predetermined value, resulting in that the output signals of the converters 7 and 9 and thereby the output signal 10a of the OR circuit 10 change their logic state from 0 to 1. The selection unit 13 responds to this by causing the switching unit 14 to connect the stand-by oscillator 2 to the output 14a in place of the oscillator 1.

When the oscillator unit according to the invention is applied at the base station of a mobile radio system, the nominal frequency of the oscillators 1, 2 and 3 is preferably within the range from 10 to 15 MHz and the predetermined permissible frequency difference is preferably 0.5 Hz.

The figure and the description related to it are only intended to illustrate the present invention. In its details, the oscillator unit according to the invention may vary within the scope of the attached claims.

I claim:

1. An oscillator unit with improved frequency stability, comprising:
   three oscillators, each having a same nominal frequency;
   an output for said oscillator unit;
   a selector for selecting said oscillators for alternative singular operative connection to said output;
   three comparators operatively associated with respective of said oscillators for comparing actual frequencies of said oscillators, in respective pairs, with one another, and with said selector for controlling said selector to replace the respective one said oscillator operatively connected at any particular time, with another said oscillator if the actual frequency of said one said oscillator deviates from the actual frequencies of the other said oscillators by at least a predetermined amount of actual frequency deviation as determined by both of said comparators with which said one oscillator is operatively associated;
   each of said comparators comprising an XOR gate having two inputs, a frequency/voltage converter for converting an output signal of the respective XOR gate to an output voltage level, and a threshold level comparator for comparing said output voltage level of the respective said frequency/voltage converter with a reference voltage corresponding to said predetermined amount of actual frequency deviation, and for generating a control signal for controlling said selector if the respective said output voltage level exceeds said reference voltage.

2. The oscillator unit of claim 1, wherein:
   said predetermined amount of actual frequency deviation is less than 0.6 Hz.

3. The oscillator unit of claim 1, wherein:
   said nominal frequency is within the range from 10 to 15 MHz.

* * * * *